United States Patent

Rincon et al.

Patent Number: 5,491,437
Date of Patent: Feb. 13, 1996

[54] AMPLIFIER CIRCUIT AND METHOD

[75] Inventors: Gabriel A. Rincon, Margate, Fla.; Nicolas Salamina; Marco Corsi, both of Dallas, Tex.

[73] Assignee: Texas Instruments Incorporated, Dallas, Tex.

[21] Appl. No.: 349,095

[22] Filed: Dec. 1, 1994

[51] Int. Cl.$^6$ ................. H03K 1/0; G06G 7/12; H03G 3/45; G05F 3/16
[52] U.S. Cl. ............ 327/108; 327/112; 327/560; 327/561; 327/575; 327/576; 327/309; 330/255; 330/257; 323/315; 323/316
[58] Field of Search ................ 327/560, 561, 327/563, 108, 112, 575, 576, 309; 323/312, 315, 316, 317; 330/252, 255, 257, 288

[56] References Cited

U.S. PATENT DOCUMENTS

| | | | |
|---|---|---|---|
| 4,612,452 | 9/1986 | Stefani et al. | 327/484 |
| 4,827,158 | 5/1989 | Matsumura | 330/288 |
| 5,144,259 | 9/1992 | Yoshida | 330/255 |
| 5,327,100 | 7/1994 | Stockstad et al. | 330/255 |

OTHER PUBLICATIONS

"Motorola Linear/Interface Devices" *Motorola* pp. 2–232, 2–78, 2–258 and 2–295.

Primary Examiner—Timothy P. Callahan
Assistant Examiner—Trong Phan
Attorney, Agent, or Firm—Paul C. Hashim; W. J. Brady, III; R. L. Donaldson

[57] ABSTRACT

An amplifier circuit (10) is provided. Amplifier (10) has an amplifier stage (14) that is coupled to control an output stage (18). Output stage (18) includes a sourcing circuit (20) and a sinking circuit (22). Output stage (18) also includes a mirror circuit (42) that is coupled to an output of amplifier stage (14). Output stage (18) also includes a current balancing circuit (30) coupled to mirroring circuit (42) and sourcing circuit (20). Mirroring circuit (42) draws current from balancing circuit (30) in response to a first predetermined output from amplifier stage (14) such that balancing circuit (30) causes an insignificant current to flow in sourcing circuit (20). Thus amplifier (10) operates to sink current from an external load (12). Alternatively, mirroring circuit (42) may draw an insignificant current from balancing circuit (30) in response to a second predetermined output of the amplifier stage (14). This causes a significant current flow in sourcing circuit (20).

20 Claims, 2 Drawing Sheets

AMPLIFIER CIRCUIT AND METHOD

CROSS REFERENCE TO RELATED APPLICATIONS

This application is related to the following commonly assigned copending applications: Attorney Docket No. TI-19828, entitled FREQUENCY COMPENSATOR CURRENT OUTPUT CIRCUIT WITH INCREASED GAIN, Ser. No. 08/349,234 filed 12/5/94 and Attorney Docket No. TI-20010, entitled AMPLIFIER CIRCUIT AND METHOD, Ser. No. 08/348,662, filed 12/1/94.

TECHNICAL FIELD OF THE INVENTION

This invention relates in general to the field of electronic devices. More particularly, the present invention relates to an amplifier circuit and method.

BACKGROUND OF THE INVENTION

Many electronic circuits use amplifiers to manipulate various signals within the circuit. The output of the amplifier may be connected to provide an output voltage to a load circuit. The design of the output stage may affect various operating aspects of the amplifier. For example, some amplifiers can deliver a high output current to the load. Other amplifiers can produce an output voltage swing that is approximately equal to the magnitude of the power supply for the amplifier circuit. Some amplifiers must provide an output that has a low crossover distortion. Yet other amplifiers are required to maintain gain and stability at relatively high frequencies. Each of these requirements places constraints upon the design of the output stage.

During operation, an amplifier circuit consumes current from a power supply. A portion of this current, known as the quiescent current, is used to bias the internal circuitry of the amplifier. A low quiescent current is desirable because it reduces the power consumption when the amplifier is operating at a light load, or with no load at all.

Previously developed amplifier output circuits have addressed some of these problems. For example, output circuits commonly referred as class A circuits provide low output distortion. Unfortunately, class A circuits inherently consume large amounts of quiescent current. A second class of output circuits is referred to as class B circuits. These circuits consume very little quiescent current. However, class B circuits exhibit substantial crossover distortion. A hybrid of the class A and class B output circuits is commonly referred to as class AB output circuits. Class AB circuits consume more quiescent current than equivalent class B circuits, but less quiescent current than equivalent class A circuits. As a result, they exhibit less crossover distortion than class B circuits but more crossover distortion than class A circuits.

Most amplifiers use class AB output circuits so as to achieve reasonable crossover distortion levels with a quiescent current of perhaps five to ten percent of the maximum allowable output current. These circuits typically have difficulty in achieving significantly lower levels of quiescent current. In addition, many prior amplifier circuits rely upon circuits which reduce the available output swing or the available frequency response to reduce the quiescent current.

SUMMARY OF THE INVENTION

The present invention provides an amplifier circuit and method that eliminates or reduces problems associated with prior circuits and methods. More particularly, in one embodiment, the present invention provides an amplifier circuit that is operable to source and sink a high current level relative to its bias current. The amplifier circuit has an amplifier stage that is coupled to control an output stage. The output stage includes a circuit for sourcing current to an external load. Additionally, the output stage has a circuit for sinking current from the external load. The sourcing and sinking circuits may comprise emitter follower circuits with a common output node. The output stage also includes a mirror circuit, such as a bipolar junction transistor having a common base with the sinking circuit, coupled to an output of the amplifier stage. Finally, the output stage comprises a current balancing circuit coupled to the mirroring circuit and the sourcing circuit. The mirroring circuit draws current from the balancing circuit in response to a first predetermined output from the amplifier stage. In turn, the balancing circuit causes an insignificant current to flow in the sourcing circuit and thus the amplifier operates to sink current from the external load. Alternatively, the mirroring circuit may draw an insignificant current from the balancing circuit in response to a second predetermined output of the amplifier stage. In this case, the balancing circuit causes a significant current flow in the sourcing circuit such that the amplifier operates to provide a significant output current to the external load.

According to another aspect of the present invention, the balancing circuit comprises first and second NPN bipolar junction transistors coupled to form a current mirror. Additionally, the balancing circuit comprises first and second current sources coupled to a collector of the first and second transistors, respectively. The balancing circuit controls the operation of the sourcing circuit by providing a variable amount of current to drive the sourcing circuit. The balancing circuit also acts so as to control and limit the amount of current flowing through the sourcing and sinking circuits when no current is delivered to the load, so as to insure a low end controlled quiescent current. This thus insures class AB operation.

A technical advantage of the present invention is that it is able to sink or source a large output current even though it is biased at a low quiescent current to reduce power consumption by the amplifier. This increases the power efficiency of the amplifier, especially at light loads. It also makes the amplifier compatible with requirements of modern micropower applications.

Another technical advantage of the present invention is that in one embodiment the range of the output voltage of an amplifier circuit constructed according to the teachings of the present invention may swing from a voltage approximately equal to the power supply down to approximately a ground potential.

Another technical advantage of the present invention is that it insures low cross-over distortion by allowing a known, and controlled, amount of current to flow in the sourcing and sinking circuits when no current is delivered to the load so as to bias both circuits into their respective regions of operation.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
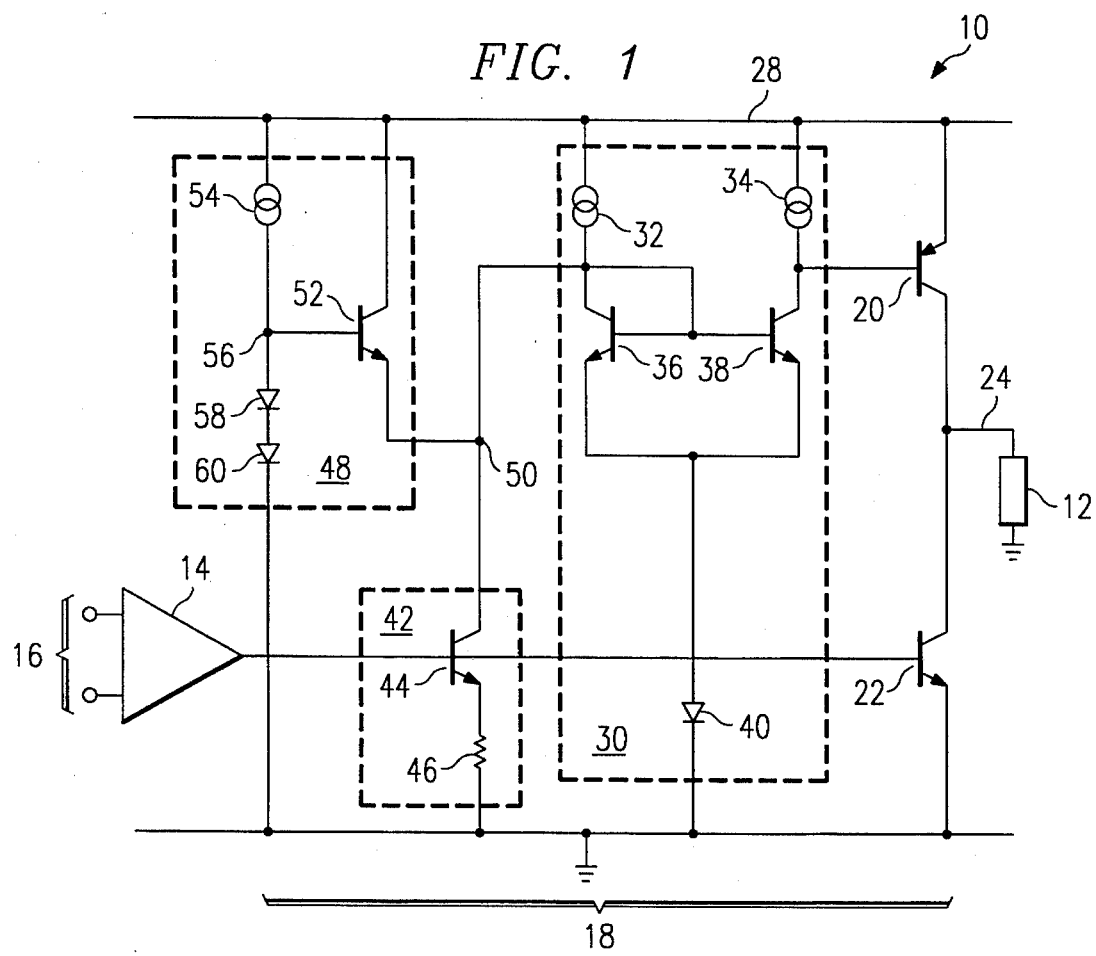
FIG. 1 is circuit schematic illustrating an embodiment of an amplifier circuit constructed according to the teachings of the present invention.

FIG. 1 is a circuit schematic illustrating an embodiment of an operational amplifier circuit indicated generally at 10 and constructed according to the teachings of the present invention. Amplifier 10 may source or sink a current from or to a load 12. Amplifier 10 also operates at a low quiescent current compared to the maximum current amplifier 10 can sink or source. Amplifier 10 outputs a voltage to load 12 that is in the range from approximately the value of a power supply for amplifier 10 down to a ground potential.

Amplifier 10 comprises an amplifier stage 14. Amplifier stage 14 may comprise any one of a number of conventional input and gain stages that provide an appropriately large gain. An input voltage is coupled to input terminals 16 of amplifier stage 14. Amplifier 10 also comprises an output stage 18 coupled to amplifier stage 14.

Figure 2:
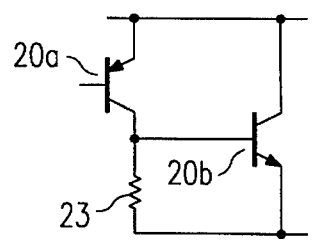
FIG. 2 is a circuit schematic of a compound PNP/NPN Darlington pair for use in the amplifier circuit of FIG. 1.

Output stage 18 sources current to and sinks current from load 12. Output stage 18 comprises a sourcing transistor 20 and a sinking transistor 22. As shown, transistor 20 comprises a single PNP bipolar junction transistor. Transistor 20 may be replaced by a pair of transistors 20a and 20b coupled in a Darlington pair as shown in FIG. 2 or any other appropriate circuit for providing an output current to load circuit 12. The Darlington pair changes the voltage swing output. In FIG. 2, transistor 20a is a PNP bipolar junction transistor and transistor 20b is an NPN bipolar junction transistor. A resistor 23 is coupled between a base and an emitter of transistor 20b. The Darlington pair thus operates as a PNP transistor with an increased beta this compound Darlington provides many of the same benefits as would a pure NPN Darlington, including small area requirements and increased current handling ability. The output swing range of the compound Darlington is superior to that of an NPN Darlington.

Transistor 22 comprises an NPN bipolar junction transistor. The collector of transistor 22 is coupled to the collector of transistor 20 at an output node 24. The emitter of transistor 20 is coupled to a power supply rail 28. The emitter of transistor 22 is coupled to a ground potential.

Amplifier 10 further comprises a current balancing circuit 30. Balancing circuit 30 is operable to control transistor 20 of output stage 18 to source a large current to load 12 relative to the bias current of output stage 18. Balancing circuit 30 comprises first and second current sources 32 and 34, first and second NPN bipolar junction transistors 36 and 38 and a diode 40. First current source 32 is coupled between power supply rail 28 and a collector of transistor 36. Second current source 34 is coupled between power supply rail 28 and a collector of transistor 38. First and second current sources 32 and 34 may comprise, for example, appropriately biased PMOS transistors in a current mirror. Transistors 36 and 38 are coupled to form a current mirror. A base of transistor 36 is coupled to a base of transistor 38. Additionally, the base of transistor 36 is coupled to the collector of transistor 36. An emitter of transistor 36 is coupled to an emitter of transistor 38. Diode 40 is coupled between the emitters of transistors 36 and 38 and a ground potential. Diode 40 of balancing circuit 30 is used to raise the voltage present at node 50 so as to allow the inclusion of a clamp circuit 48 to provide additional benefits, as described below.

Output stage 18 further comprises a mirror circuit 42 coupled to a base of transistor 22 and a collector of transistor 36. Mirror circuit 42 comprises an NPN bipolar junction transistor 44 and a resistor 46. A collector of transistor 44 is coupled to a collector of transistor 36. A base of transistor 44 is coupled to the base of transistor 22 and to an output of amplifier stage 14. An emitter of transistor 44 is coupled through resistor 46 to a ground potential. It is noted that transistor 44 may be replaced with an appropriate Darlington pair of NPN bipolar junction transistors, so as to reduce the output current drive requirements of amplifier stage 14. Transistor 44 forms a current mirror with transistor 22. At relatively low current levels, the currents through the emitters of transistors 44 and 22 are ratioed in the same proportions as the ratios of the emitter areas of these transistors. At higher current levels, resistor 46 reduces the base emitter Voltage of transistor 44, decreasing the current which flows through the emitter of transistor 44. This makes the relationship between the current in transistor 44 and transistor 22 non-linear. Resistor 46 thus controls the rate at which current flow in transistor 44 increases relative to the current flow in transistor 22.

A clamp circuit 48 is coupled to node 50 to prevent transistor 44 from saturating and consuming excessive base current. Clamp 48 comprises a transistor 52. A collector of transistor 52 is coupled to power supply rail 28. An emitter of transistor 52 is coupled to node 50. A base of transistor 52 is coupled to a current source 54 at a node 56. Current source 54 is coupled to power supply rail 28. First and second diodes 58 and 60 are coupled between node 56 and a ground potential. Diodes 58 and 60 may comprise diode coupled transistors or any other appropriate diode for establishing a voltage at node 56. In order to insure that the voltage at node 50 will be sufficiently high during normal operation to prevent the clamp from conducting current, diode 40 is added to balancing circuit 30.

In operation, amplifier 10 amplifies an input signal at input terminals 16 to produce an output signal for load 12 at node 24. Output stage 18 may either source current to load 12 or sink current from load 12. In sourcing current to load 12, the output of amplifier stage 14 is brought to a low potential voltage. This causes transistors 22 and 44 to conduct an insignificant amount of current. This is referred to as the "off" state of transistors 22 and 44. It is noted that transistors 22 and 44 are coupled such that the emitter current of transistor 44 is substantially mirrored or replicated in transistor 22 at low currents due to negligible voltage drop across resistor 46. Because transistor 44 is turned off, current is directed from current source 32 to the collector of transistor 36. This current is mirrored in transistor 38 proportional to the ratio of transistor 38 to transistor 36. If transistors 36 and 38 are formed in a one-to-one ratio, the current in transistor 36 is replicated in transistor 38. A portion of the current drawn by transistor 38 is opposed by current source 34, and the remainder is drawn from the base of transistor 20. The base current of transistor 20 is multiplied by the beta of transistor 20 to form the current delivered by transistor 20 to load 12. The voltage at node 24 thus rises to be approximately equal to the voltage at power supply rail 28. If a Darlington pair as shown in FIG. 2 is used, a second power supply rail having a lower voltage may be used to achieve a voltage swing at node 24 that is substantially equal to the lower power supply voltage. The lower supply must be lower than the higher voltage supply by a base-emitter voltage plus a saturation voltage. This is advantageous because the voltage drop across transistor 20b of the Darlington pair can be reduced, which reduces power dissipated within amplifier 10 and so increases overall efficiency.

Output stage 18 may also act as a current sink for load 12. To act as a sink, the output voltage of amplifier stage 14 causes transistor 44 to conduct current between its collector and emitter. This is referred to as the "on" state of the transistor. The current through transistor 44 is substantially mirrored in transistor 22, at least at lower current levels where the voltage drop across resistor 46 is negligible. It is noted that the size of transistors 44 and 22 may be scaled such that the current in transistor 22 is related to the current in transistor 44 by a selected ratio. The increase in transistor 44 operates to reduce the current in transistor 36 by drawing current from current source 32. The decrease in current in transistor 36 is mirrored by a corresponding decrease in the current in transistor 38. This reduces the amount of current drawn from the base of transistor 20 and thus reduces the collector current of transistor 20. If the current through the collector of transistor 44 is sufficiently large, transistor 38 will be unable to draw enough current to oppose current source 34. Then current source 34 will pull the base of transistor 20 to a high voltage, shutting off transistor 20. Since transistor 20 draws a current through its collector which is controlled by the voltage output by amplifier 14, output stage 18 operates to sink current from load 12.

Clamping circuit 48 prevents the voltage at node 50 from dropping to a voltage that would allow transistor 44 to saturate and draw excessive current from the output of amplifier stage 14. During the sinking operation, the voltage at node 50 tends to decrease toward a ground potential. The voltage at node 56 is approximately two diode drops above ground potential. Therefore, transistor 52 begins to conduct current at its emitter when the voltage at node 50 reaches one diode voltage drop above ground potential. This establishes the voltage at node 50 and prevents transistor 44 from saturating.

Resistor 46 controls the rate at which current increases in transistor 44 through a transcendental relationship. At low currents, the emitter current of transistor 44 is approximately equal to the emitter current of transistor 22 assuming that transistors 22 and 44 are scaled in a one to one relationship. At high current, resistor 46 prevents the emitter current in transistor 44 increasing at the same rate as the emitter current in transistor 22. This also allows output stage 18 to operate at a lower bias current when sinking relatively large currents.

Figure 3:
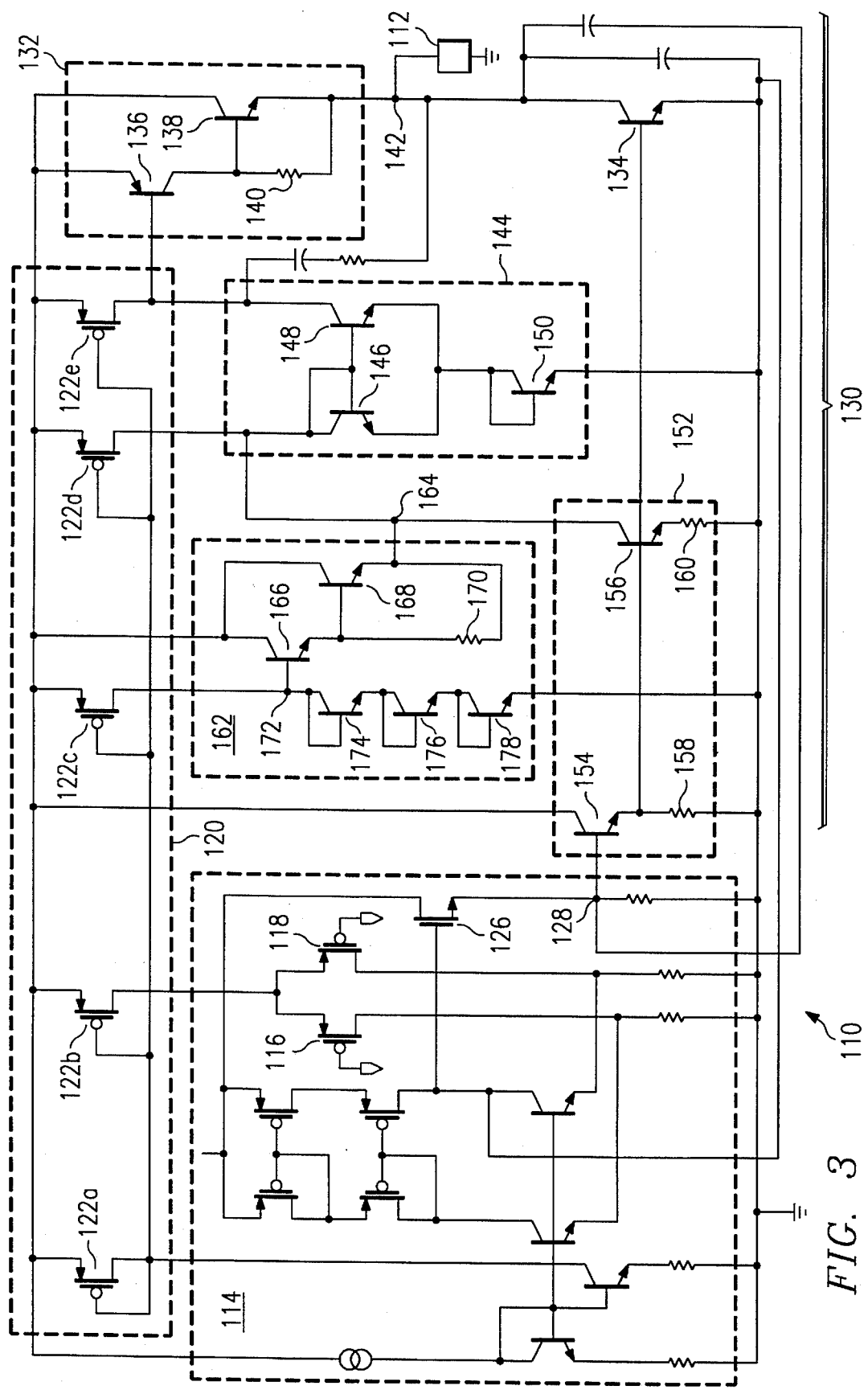
FIG. 3 is a circuit schematic illustrating another embodiment of an amplifier circuit constructed according to the teachings of the present invention.

FIG. 3 is a circuit schematic illustrating another embodiment of an operational amplifier circuit indicated generally at 110 and constructed according to the teachings of the present invention. Assuming worst case betas of approximately 30 and a bias current 50 microamps, amplifier 110 may source or sink a current on the order of 25 to 30 milliamps from or to a load 112. Amplifier 110 also operates at a low quiescent current compared to the maximum current amplifier 110 can source or sink. Amplifier 110 outputs a voltage to load 112 that is in the range from approximately one volt less than the value of a power supply down to approximately a ground potential.

Amplifier 110 comprises an amplifier stage 114. Amplifier stage 114 may comprise any one of a number of conventional input and gain stages that provide an appropriately large gain. As shown, amplifier stage 114 comprises a BiCMOS folded cascode amplifier stage. An input voltage is coupled to input transistors 116 and 118 of amplifier stage 114. Transistors 116 and 118 comprise PMOS transistors coupled in a conventional differential pair configuration. Amplifier 110 also comprises a current mirror 120 comprising a plurality of PMOS transistors 122a through 122e. Current mirror 120 provides current for the operation of amplifier 110. Current source 120 is coupled to a power supply rail 124. Amplifier stage 114 includes an output transistor 126. Amplifier 114 provides an output at the source of transistor 126 at node 128. Node 128 is coupled to an output stage 130 of amplifier 110.

Output stage 130 sources current to and sinks current from load 112. Output stage 130 comprises a sourcing circuit 132 and a sinking transistor 134. As shown, sourcing circuit 132 comprises a PNP bipolar junction transistor 136 and an NPN bipolar junction transistor 138, respectively. Transistor 136 and 138 are coupled to form a Darlington pair with a base turn-off resistor 140. The output of sourcing circuit 132 comprises the emitter of transistor 138 at node 142. The collector of transistor 138 and the collector of transistor 136 are coupled to power supply rail 124. A collector of sinking transistor 134 is coupled to output node 142. Additionally, an emitter of transistor 134 is coupled to a ground potential.

Amplifier 110 further comprises a balancing circuit 144. Balancing circuit 144 is operable to control sourcing circuit 132 of output stage 130 to source a large current to load 112 relative to the bias current of output stage 130. Balancing circuit 144 comprises first and second NPN bipolar junction transistors 146 and 148 and a diode coupled transistor 150. Transistors 146 and 148 are coupled to form a current mirror. A collector of transistor 146 is coupled to a base of transistor 146 and a base of transistor 148. Additionally, an emitter of transistor 146 is coupled to an emitter of transistor 148. A collector of transistor 146 is coupled to transistor 122d of current mirror 120 to provide a current source for transistor 146. Additionally, transistor 122e of current mirror 120 is coupled to a collector of transistor 148 to provide a separate current source for transistor 148. The collector of transistor 148 is also coupled to the base of transistor 136 to provide an output to sourcing circuit 132.

Output stage 130 further comprises a mirror circuit 152. Mirror circuit 152 comprises first and second NPN bipolar junction transistors 154 and 156 coupled to form a Darlington pair with a base turn-off resistor 158. A base of transistor 154 is coupled to node 128 at the output of amplifier stage 114. The collector of transistor 154 is coupled to power supply 124. An emitter of transistor 154 is coupled to a base of transistors 156 and 134. An emitter of transistor 156 is coupled through a resistor 160 to a ground potential. A collector of transistor 156 is coupled to balancing circuit 144 at the collector of transistor 146. Resistor 160 is chosen to control the non-linear rate at which the current in mirror circuit 152 increases during a sinking operation. Mirror circuit 152 forms a current mirror with transistor 134.

A clamp circuit 162 is coupled to node 164 to prevent transistor 156 of mirror circuit 148 from falling below its saturation voltage. Clamp 162 comprises first and second NPN bipolar junction transistors 166 and 168 coupled in a Darlington pair with a base turn-off resistor 170. A collector of transistors 166 and 168 is coupled to power supply rail 124. An emitter of transistor 168 is coupled to node 164. A base of transistor 166 is coupled to current source 120 at node 172. First, second, and third diode connected NPN bipolar junction transistors 174, 176 and 178, respectively, are coupled between node 172 and a ground potential.

In operation, amplifier circuit 110 operates in substantially the same manner as amplifier circuit 10 of FIG. 1. Amplifier circuit 110 uses a compound PNP/NPN Darlington sourcing circuit 132 comprising transistors 136 and 138 to increase the current which can be sourced to load 112. This reduces the upper voltage swing capability of output stage 130. In addition, output transistor 134 is effectively part of a Darlington pair with transistor 154 increasing the current which amplifier 160 can sink from load 112. Clamp 162 also uses a Darlington pair comprised of transistors 166 and 168 to allow reduced bias current operation, and this requires the addition of diode connected transistor 178 to insure that clamp 162 operates to produce a lower voltage limit of one diode drop at node 164.

Although the present invention has been described in detail, it should be understood that various changes, substitutions and alterations can be made hereto without departing from the spirit and scope of the invention as defined by the appended claims. For example various NPN and PMOS transistors in FIG. 1 may be changed to be PNP and NMOS transistors, respectively. The polarity of circuits 10 may thus be changed to provide an amplifier with a negative voltage output.

What is claimed is:

1. An output stage of an amplifier circuit having an input amplifier stage, said output stage comprising:

circuitry operable to source an output current to an external load;

circuitry coupled to said sourcing circuitry and operable to sink current from the external load, said sourcing circuitry and said sinking circuitry having a common output node;

mirroring circuitry responsive to the input amplifier stage, coupled to said sinking circuitry and operable to approximately mirror the current in said sinking circuitry;

a current balancing circuit responsive to said mirroring circuitry and coupled to control current flow through said sourcing circuitry over a prescribed range;

said mirroring circuitry operable to draw current from said balancing circuit in response to a first predetermined output from the input amplifier stage such that said balancing circuit causes an insignificant current to flow in said sourcing circuitry and said mirroring circuit operable to cause said sinking circuit to sink a significant current from the external load; and said mirroring circuitry operable to draw an insignificant current from said balancing circuit in response to a second predetermined output from the input amplifier stage such that said balancing circuit causes a significant current to flow in said sourcing circuitry.

2. The output stage of claim 1, wherein said sinking circuitry comprises an NPN bipolar junction transistor and said sourcing circuitry comprises a PNP bipolar junction transistor.

3. The output stage of claim 1, wherein said sourcing circuitry comprises:

a PNP bipolar junction transistor; and an NPN bipolar junction transistor having a base coupled to an emitter of said PNP transistor to form a Darlington pair.

4. The output stage of claim 1, wherein said current balancing circuit comprises:

first and second current sources;

first and second transistors;

said transistors coupled to form a current mirror;

a collector of said first transistor coupled to a base of said first transistor, a base of said second transistor, said first current source and said mirroring circuitry; and a collector of said second transistor coupled to said sourcing circuitry and said second current source such that the current in said first transistor is mirrored in said second transistor to control said sourcing circuitry.

5. The output stage of claim 1, wherein said current balancing circuit comprises:

first and second circuit sources;

first and second transistors;

said transistors coupled to form a current mirror;

a diode coupled between an emitter of said transistors and a ground potential;

a collector of said first transistor coupled to a base of said first transistor, a base of said second transistor, said first current source and said mirroring circuitry; and a collector of said second transistor coupled to said sourcing circuitry and said second current source such that the current in said first transistor is mirrored in said second transistor to control said sourcing circuitry.

6. The output stage of claim 1, wherein said mirroring circuitry comprises an NPN bipolar junction transistor having a resistor coupled between an emitter of said transistor and a ground potential, said resistor operable to control the rate of increase of current through said mirroring circuitry as said output stage performs a sinking operation.

7. The output stage of claim 1, wherein said mirroring circuitry comprises an NPN bipolar junction transistor, and further comprising a voltage clamp coupled to said transistor for establishing a predetermined lower voltage limit to prevent said transistor from interfering with said sinking circuitry during a sinking operation.

8. The output stage of claim 1, wherein said mirroring circuitry comprises an NPN bipolar junction transistor, said output stage further comprising:

a voltage clamp coupled to said mirroring circuitry for establishing a predetermined lower voltage limit to prevent said mirroring circuitry from interfering with said sinking circuitry during a sinking operation; and a resistor coupled between an emitter of said transistor of said mirroring circuitry and a ground potential, said resistor operable to control the rate of increase of current through said mirroring circuitry.

9. The output stage of claim 1, and further comprising a voltage clamp for establishing a predetermined lower voltage limit for said mirroring circuitry, said clamp comprising:

first and second diodes coupled in series between a current source and ground; and an NPN bipolar junction transistor having a base coupled to an output of said current source and an emitter coupled to said mirroring circuitry.

10. The output stage of claim 1, and further comprising a voltage clamp for establishing a predetermined lower voltage limit for said mirroring circuitry, said clamp comprising:

first, second and third diodes coupled in series between a current source and ground; and a Darlington pair of NPN bipolar junction transistors having a base coupled to an output of said current source and an emitter coupled to said mirroring circuitry.

11. The output stage of claim 1, wherein said mirroring circuitry comprises first and second NPN bipolar junction transistors coupled to form a Darlington pair.

12. An operational amplifier, comprising:

an input amplifier stage having an output;

a bipolar junction transistor for sourcing current to an external load;

a bipolar junction transistor for sinking current from the external load, a collector of said sourcing transistor coupled to a collector of said sinking transistor to form a common output node;

a mirroring bipolar junction transistor having a base coupled to a base of said sinking transistor such that current in said sinking transistor approximately mirrors current in said mirroring transistor;

a current balancing circuit responsive to said mirroring transistor and coupled to control current flow through said sourcing transistor over a prescribed range;

said mirroring transistor operable to draw current from said balancing circuit in response to a first predetermined output from the input amplifier stage such that said balancing circuit causes an insignificant current to flow in said sourcing transistor and said mirroring circuit operable to cause said sinking transistor to sink a significant current from the external load; and said mirroring transistor operable to draw an insignificant current from said balancing circuit in response to a second predetermined output from the input amplifier stage such that said balancing circuit causes a significant current to flow in said sourcing transistor.

13. The amplifier of claim 12, wherein said sourcing transistor comprises a PNP bipolar junction transistor and said sinking and mirroring transistors comprise NPN bipolar junction transistors.

14. The amplifier of claim 12, wherein said sourcing transistor comprises:

a PNP bipolar junction transistor; and an NPN bipolar junction transistor having a base coupled to an emitter of said PNP transistor to form a Darlington pair.

15. The amplifier of claim 12, wherein said current balancing circuit comprises:

first and second current sources;

first and second transistors;

said transistors coupled to form a current mirror;

a collector of said first transistor coupled to a base of said first transistor, a base of said second transistor, said first current source and said mirroring transistor; and a collector of said second transistor coupled to said sourcing transistor and said second current source such that the current in said first transistor is mirrored in said second transistor to control said sourcing transistor.

16. The amplifier of claim 12, wherein said current balancing circuit comprises:

first and second current sources;

first and second transistors;

said transistors coupled to form a current mirror;

a diode coupled between an emitter of said transistors and a ground potential;

a collector of said first transistor coupled to a base of said first transistor, a base of said second transistor, said first current source and said mirroring transistor; and a collector of said second transistor coupled to said sourcing transistor and said second current source such that the current in said first transistor is mirrored in said second transistor to control said sourcing transistor.

17. The amplifier of claim 12, wherein said mirroring transistor comprises an NPN bipolar junction transistor, said amplifier further comprising:

a voltage clamp coupled to said mirroring transistor for establishing a predetermined lower voltage limit to prevent said mirroring transistor from interfering with said sinking transistor during a sinking operation; and a resistor coupled between an emitter of said mirroring transistor and a ground potential, said resistor operable to control the rate of increase of current through said mirroring transistor.

18. The amplifier of claim 12, and further comprising a voltage clamp for establishing a predetermined lower voltage limit for said mirroring transistor, said clamp comprising:

first and second diodes coupled in series between a current source and a ground potential; and an NPN bipolar junction transistor having a base coupled to an output of said current source and an emitter coupled to a collector of said mirroring transistor.

19. A method for controlling an output current of an amplifier circuit having sourcing and sinking circuits coupled to a common output node, said method comprising the steps of:

generating a control output signal from an input amplifier stage of the amplifier circuit in response to an input to the amplifier circuit;

providing the control signal to the sinking circuit and to a mirror circuit that mirrors an output current;

drawing current from a current balancing circuit in response to a first predetermined output of the amplifier stage such that the balancing circuit causes an insignificant current to flow in the sourcing circuit and significant current flow in the sinking circuit; and drawing an insignificant current from said balancing circuit in response to a second predetermined output from the amplifier stage such that the balancing circuit causes a significant current to flow in said sourcing circuitry, said balancing circuit being responsive to said mirroring circuitry and operable to control current flow through the sourcing circuitry over a prescribed range.

20. The method of claim 19, and further comprising the steps of:

establishing a predetermined lower voltage limit at the collector of a transistor of the mirror circuit with a voltage clamp; and limiting the high current range of the transistor of the mirror circuit by a resistor coupled to the emitter of the transistor such that the transistor does not saturate during a sinking operation and divert current from the sinking circuit.

\* \* \* \* \*

(12) EX PARTE REEXAMINATION CERTIFICATE (8454th)
United States Patent
Rincon et al.

(10) Number: US 5,491,437 C1
(45) Certificate Issued: Aug. 9, 2011

(54) AMPLIFIER CIRCUIT AND METHOD

(76) Inventors: Gabriel A. Rincon, Margate, FL (US);
Nicolas Salamina, Dallas, TX (US);
Marco Corsi, Dallas, TX (US)

Reexamination Request:
No. 90/010,405, Feb. 11, 2009

Reexamination Certificate for:
Patent No.: 5,491,437
Issued: Feb. 13, 1996
Appl. No.: 08/349,095
Filed: Dec. 1, 1994

(51) Int. Cl.
*H03F 3/30* (2006.01)

(52) U.S. Cl. .................. 327/108; 327/112; 327/560;
327/561; 327/575; 327/576; 327/309; 330/255;
330/257; 323/315; 323/316

(58) Field of Classification Search .................. None
See application file for complete search history.

(56) References Cited

U.S. PATENT DOCUMENTS

| | | | |
|---|---|---|---|
| 4,078,207 A | | 3/1978 | Leidich |
| 4,612,452 A | * | 9/1986 | Stefani et al. ............ 327/377 |
| 4,714,897 A | | 12/1987 | Murari et al. |
| 4,800,339 A | | 1/1989 | Tanimoto et al. |

OTHER PUBLICATIONS

Sallaerts et al., "A Single–Chip U–Interface for Transceiver for ISDN", IEEE JSSC, vol. SC–22, No. 6, Dec. 1987, pp. 1011–1021, USA.

Buttle et al., "A Multirate Transceiver IC for Four–Wire Full Duplex Data Transmission", IEEE ISSCC, 1991, USA.

Buttle et al., A Multirate Transceiver IC for Four–Wire Full–Duplex Data Transmission:, IEEE JSSC, vol. 26, No. 12, Dec. 1991, pp. 1928–1935, USA.

Fisher et al., "A Highly Linear CMOS Buffer Amplifier", IEEE JSSC, vol. SC–22, No. 3, Jun. 1987, pp. 330–334, USA.

* cited by examiner

*Primary Examiner* — Margaret Rubin

(57) ABSTRACT

An amplifier circuit (10) is provided. Amplifier (10) has an amplifier stage (14) that is coupled to control an output stage (18). Output stage (18) includes a sourcing circuit (20) and a sinking circuit (22). Output stage (18) also includes a mirror circuit (42) that is coupled to an output of amplifier stage (14). Output stage (18) also includes a current balancing circuit (30) coupled to mirroring circuit (42) and sourcing circuit (20). Mirroring circuit (42) draws current from balancing circuit (30) in response to a first predetermined output from amplifier stage (14) such that balancing circuit 30) causes an insignificant current to flow in sourcing circuit (20). Thus amplifier (10) operates to sink current from an external load (12). Alternatively, mirroring circuit (42) may draw an insignificant current from balancing circuit (30) in response to a second predetermined output of the amplifier stage (14). This causes a significant current flow in sourcing circuit (20).

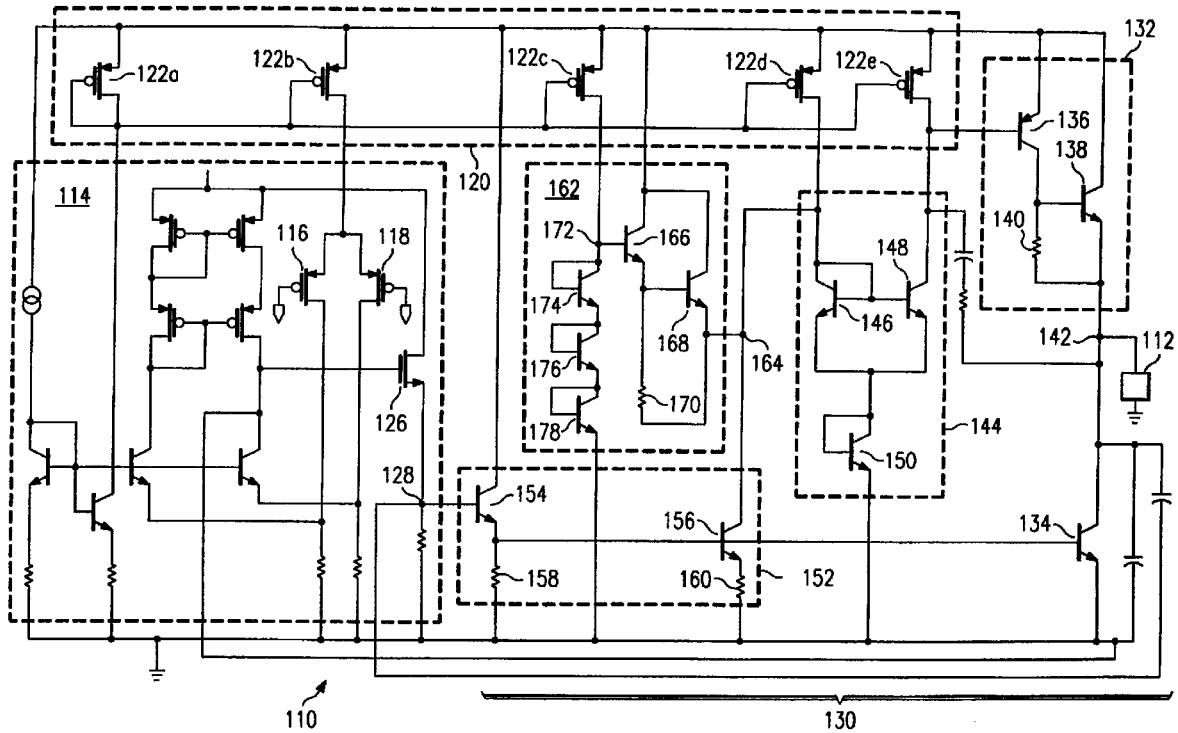

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 19 are determined to be patentable as amended.

Claims 2-18 and 20 were not reexamined.

1. An output stage of an amplifier circuit having an input amplifier stage, said output stage comprising:
   circuitry operable to source an output current to an external load;
   circuitry coupled to said sourcing circuitry and operable to sink current from the external load, said sourcing circuitry and said sinking circuitry having a common output node;
   mirroring circuitry responsive to the input amplifier stage, coupled to said sinking circuitry and operable to approximately mirror the current in said sinking circuitry;
   a current balancing circuit responsive to said mirroring circuitry and coupled to control current flow through said sourcing circuitry over a prescribed range, *said current balancing circuit comprising a current mirror, said sourcing circuitry not part of a current mirror*;
   said mirroring circuitry operable to draw current from said balancing circuit in response to a first predetermined output from the input amplifier stage such that said balancing circuit causes an insignificant current to flow in said sourcing circuitry *solely as a direct result of said current drawn from said balancing circuit by said mirroring circuitry* and said mirroring circuit operable to cause said sinking circuit to sink a significant current from the external load; and
   said mirroring circuitry operable to draw an insignificant current from said balancing circuit in response to a second predetermined output from the input amplifier stage such that said balancing circuit causes a significant current to flow in said sourcing circuitry *as a direct result of said insignificant current drawn from said balancing circuit by said mirroring circuitry*.

19. A method for controlling an output current of an amplifier circuit having sourcing and sinking circuits coupled to a common output node, said method comprising the steps of:
    generating a control output signal from an input amplifier stage of the amplifier circuit in response to an input to the amplifier circuit;
    providing the control signal to the sinking circuit and to a mirror circuit that mirrors an output current;
    drawing current from a current balancing circuit in response to a first predetermined output of the amplifier stage such that the balancing circuit causes an insignificant current to flow in the sourcing circuit and significant current flow in the sinking circuit *solely as a direct result of said mirror circuit, said current balancing circuit comprising a current mirror, said sourcing circuit not part of a current mirror*; and
    drawing an insignificant current from said balancing circuit in response to a second predetermined output from the amplifier stage such that the balancing circuit causes a significant current to flow in said sourcing circuitry *solely as a direct result of said mirror circuit*, said balancing circuit being responsive to said mirroring circuitry and operable to control current flow through the sourcing circuitry over a prescribed range.

\* \* \* \* \*